(12) United States Patent
Liu et al.

(10) Patent No.: US 9,064,784 B1
(45) Date of Patent: Jun. 23, 2015

(54) BALL GRID ARRAY PACKAGE WITH LASER VIAS AND METHODS FOR MAKING THE SAME

(75) Inventors: Chenglin Liu, San Jose, CA (US); Chender Chen, Fongyuan (TW); Xiaoting Chang, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 184 days.

(21) Appl. No.: 12/819,088

(22) Filed: Jun. 18, 2010

Related U.S. Application Data

(60) Provisional application No. 61/218,309, filed on Jun. 18, 2009.

(51) Int. Cl.
*H01L 23/498* (2006.01)
*H01L 23/00* (2006.01)

(52) U.S. Cl.
CPC .................................... *H01L 24/19* (2013.01)

(58) Field of Classification Search
CPC .............. H01L 21/4853; H01L 21/486; H01L 2224/16; H01L 2924/01019; H01L 2924/01025; H01L 2924/01057; H01L 2924/01078; H01L 2924/01079; H01L 2924/09701; H01L 2924/15311; H01L 2924/3011

USPC ........................................................ 257/758
See application file for complete search history.

(56) References Cited

U.S. PATENT DOCUMENTS

| | | | | |
|---|---|---|---|---|
| 6,132,853 | A * | 10/2000 | Noddin | 428/209 |
| 2003/0082896 | A1* | 5/2003 | Cheng | 438/612 |
| 2010/0289145 | A1* | 11/2010 | Chipalkatti et al. | 257/758 |

* cited by examiner

*Primary Examiner* — Stephen W Smoot
*Assistant Examiner* — Edward Chin

(57) ABSTRACT

A packaged IC having laser vias and methods for making the same. The packaged IC includes a die having bond pads thereon, wire bonds contacting the bond pads, and a substrate configured to electrically connect the wire bonds and external package connectors. The substrate includes mechanical vias through the substrate layers and laser vias in an uppermost substrate layer. Each laser via is closer to the die than the mechanical vias that do not overlap or are not covered by the die. The method includes routing traces on uppermost and lowermost layers, the traces electrically connecting wire bonds and external package connectors, forming mechanical vias through all layers of the substrate, forming laser vias in the uppermost substrate layer, and electrically connecting each wire bond to one trace on the uppermost substrate layer.

10 Claims, 6 Drawing Sheets

BALL GRID ARRAY PACKAGE WITH LASER VIAS AND METHODS FOR MAKING THE SAME

RELATED APPLICATIONS

This application claims the benefit of U.S. Provisional Application No. 61/218,309, filed Jun. 18, 2009, incorporated herein by reference in its entirety.

FIELD OF THE INVENTION

The present invention generally relates to the field of semiconductor and/or integrated circuit packaging. More specifically, embodiments of the present invention pertain to circuits, architectures, systems, and methods for configuring a hybrid via ball grid array (BGA).

BACKGROUND

Integrated circuit packages (e.g., ball grid array packages, etc.) may include a substrate that can be similar to a small printed-circuit board. For example, the substrate may include several layers that are laminated together or otherwise attached to each other. The substrate can be used to route signals from a die or chip (or multiple chips) on the substrate to the balls on the bottom of the BGA package for connection to the outside world, for example via a larger printed-circuit board. The chips may include a plurality of bonding pads connected with bond wiring. The substrate may also include substrate traces in one or more routing layers of the substrate that provide electrical connections from the bond wires to the balls via one or more vias formed in the substrate.

Integrated circuits are decreasing in size. For example, semiconductor die sizes are becoming increasingly smaller, and in turn, die pad pitches are shrinking accordingly. Consequently, a relatively thin gold wire is needed for smaller die pad pitches. The cost of gold wire is a major contributor to the cost of producing a BGA. The gold content used in BGA production may be reduced by decreasing the gold wire length and/or the gold wire diameter. The wire length can be reduced by reducing the wire bonding finger pitch. However, this may result in wire bonding assembly yield loss and substrate cost increases due to the small finger pitches and traces pitch needed.

As the bond pad pitch decreases with the decreasing size of the die, the maximum wire diameter becomes limited. In addition, the maximum wire length is related to the maximum wire diameter. In general (e.g., for stability purposes), the thinner the bond wire, the shorter its maximum length becomes. Consequently, space for wire bonding on the substrate becomes an issue as the area surrounding the die becomes congested when shorter wires are used.

A cross-section of a conventional BGA package 100 is shown in FIG. 1A. A die 110 is on an uppermost layer 122 of the BGA substrate 120. Generally, the die 110 includes a plurality of bond pads (not shown) for connecting bond wires 150 to the substrate traces 121 on the upper surface of the uppermost substrate layer 122. The traces 121 connect the bond wires 150 to the ball bonds 140a-d, through one or more mechanical vias 130a-b, and one or more traces 127 on the lowermost surface of the lowermost substrate layer 126. However, it is difficult to mechanically drill vias relatively close to the die 110 because the diameter of the mechanically-drilled vias 130a-b is generally too large. This results in relatively high surface area of the substrate 120. Furthermore, as the distance between the mechanically-drilled vias 130a-b and the bond pads on the die 110 increases, the costs of packaging increase because more gold bonding wire is needed to make connections with bonding fingers (not shown) on the traces 121. Additional drawbacks of conventional BGA packaging approaches include the relative inflexibility of the placement of mechanically-drilled vias 130a-b in the substrate 120, discussed in further detail with regard to FIG. 3B.

FIG. 1B illustrates a top-down view of parts of the conventional BGA package 100 of FIG. 1A. Bond pads 115 may be positioned on the die 110 linearly, staggered, or in a concentric ring or other pattern. Bond wires 150 connect the bond pads 115 to the substrate traces 121 on the uppermost layer of the substrate 120.

FIG. 1C shows a cross-section of conventional BGA substrate 120. An insulative layer 128 may be formed over traces 121 and 160 on the uppermost layer 122 of substrate 120. Each bond wire (not shown) is attached or bonded to a bonding finger 161 exposed through an opening 111 in the insulative layer 128. The trace 160 connects one of the bond wires to a mechanical via 130 extending through the uppermost substrate layer 122, the middle substrate layer 124, and the lowermost substrate layer 126. One or more traces 127 electrically connect the mechanical via 130 to a ball bond (not shown) on a bump pad (not shown, but similar to bump pad 152 in the opening 151 in passivation layer 129) on the lowermost substrate layer 126. Traces 123 and 125 may be formed on substrate layer 124 on in substrate layers 122 and 126.

However, the conventional BGA substrate 120 of FIGS. 1A and 1C is relatively inflexible with regard to the placement of mechanically-drilled vias 130a-b. For example, referring to FIG. 1A, the number and the location of the mechanically-drilled vias 130a-b in the substrate 120 are restricted by the location of the ball bonds 140a-d under the lowermost substrate layer 126. Generally, the mechanically drilled vias 130a-b cannot be placed onto the ball area (e.g., opening 151 in the passivation layer 129 in FIG. 1C). As a result, options for routing the traces are also relatively inflexible.

Referring to FIG. 2, the diameter of the mechanical vias 230 (designated by the double-headed arrow labeled "A") is relatively large, and therefore the mechanical vias 230 must be placed at least a minimum distance from the die 250. As a result, a relatively large surface area of the substrate is consumed, and longer bond wires for connection to the bond fingers 260 (e.g., through openings 211 in a passivation layer on the substrate) are needed. The length of the bond wires become an even more significant issue when one uses multiple rows of bond fingers (e.g., see distance "B" between die 250 and a second row of openings 212 for exposing bond fingers on the substrate). Furthermore, when a larger diameter wire is used, greater spacing between neighboring bond wires is also necessary.

FIG. 3 illustrates a cross-section of an alternative embodiment 300 of a conventional BGA package, in which laser vias 340a-b are formed in an uppermost layer 322 of a BGA substrate 320, and laser vias 345a-b are formed in a lowermost layer 326 of the BGA substrate 320. A die 310 is on the uppermost substrate layer 322. In general, bond wires 360 connect a plurality of bond pads (not shown) on the die 310 to substrate traces 321 on the upper surface of the uppermost substrate layer 322. The traces 321 connect the bond wires 360 to the balls 350a-b under the lowermost substrate layer 326 through one of the laser vias 340a-b in an uppermost substrate layer 322, one or more traces 323 on a middle layer 324 of the substrate 320, one of the mechanical vias 330a-b in the middle substrate layer 324, one or more traces 325 between substrate layers 324 and 326, one of the laser vias 345a-b in the lowermost substrate layer 326, and one or more traces 327 on the lowermost surface of the lowermost substrate layer 326. Locating the mechanical vias only in the middle layer 324, and the laser vias 340a-b and 345a-b in the uppermost and lowermost layers 322 and 326 of the substrate 320 may eliminate some of the drawbacks discussed in FIG. 1A. However, additional drawbacks result from the conventional BGA package 300 of FIG. 3, including an increased number of via formation processes and/or steps, possible limitations of current-carrying capacity and/or drive strength of a signal to or from an external package connection 350a-b to the die 310, etc., resulting in increased costs and decreased yields in the conventional BGA package 300.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to circuitry, architectures, systems, and methods for low cost hybrid wire bonding. In one aspect, the packaged integrated circuit and/or architectures generally comprise (a) a die having a plurality of bond pads thereon, (b) a plurality of wire bonds electrically contacting the plurality of bond pads, and (c) a substrate having a plurality of layers therein configured to electrically connect the plurality of wire bonds and a plurality of external package connections, wherein the substrate includes (i) a plurality of mechanical vias, each mechanical via being through the plurality of substrate layers, and (ii) a plurality of laser vias in at least an uppermost layer of the substrate, each of the laser vias being closer to the die than each of the mechanical vias that do not overlap with the die or that are not covered by the die. The system and/or apparatuses generally comprise those that include a circuit or architecture embodying one or more of the inventive concepts disclosed herein.

In a further aspect, the method of packaging an integrated circuit generally comprises (1) routing a plurality of traces on at least an uppermost layer and a lowermost layer of a substrate, wherein the plurality of traces are configured to electrically connect a plurality of wire bonds from a corresponding plurality of bond pads on a die and the external package connections, (2) forming mechanical vias through all of the layers of the substrate, (3) forming laser vias in at least the uppermost layer of the substrate, each of the laser vias being closer to the die than each of the mechanical vias that do not overlap with the die or that are not covered by the die, and (4) electrically connecting each of the plurality of wire bonds to one of the plurality of traces through one of a plurality laser vias in an uppermost layer of the substrate.

The present disclosure advantageously provides low cost wire bonding in a ball grid array package relative to conventional wire bonding by utilizing laser vias. Additional advantages include, but are not limited to, a reduction in wire usage, use of bond wires having smaller diameters, and use of fewer and/or less expensive manufacturing process and/or steps (e.g., mechanical drilling the mechanical layers through all the layers of the substrate, and limiting laser drilling to only the top layer of the substrate). Thus, the present disclosure enables decreased assembly cost and increased assembly yields by decreasing the gold wire content and decreasing the number of relatively complicated steps used in the production of a BGA package. These and other advantages of the present invention will become readily apparent from the detailed description below.

DETAILED DESCRIPTION

Figure 1A:
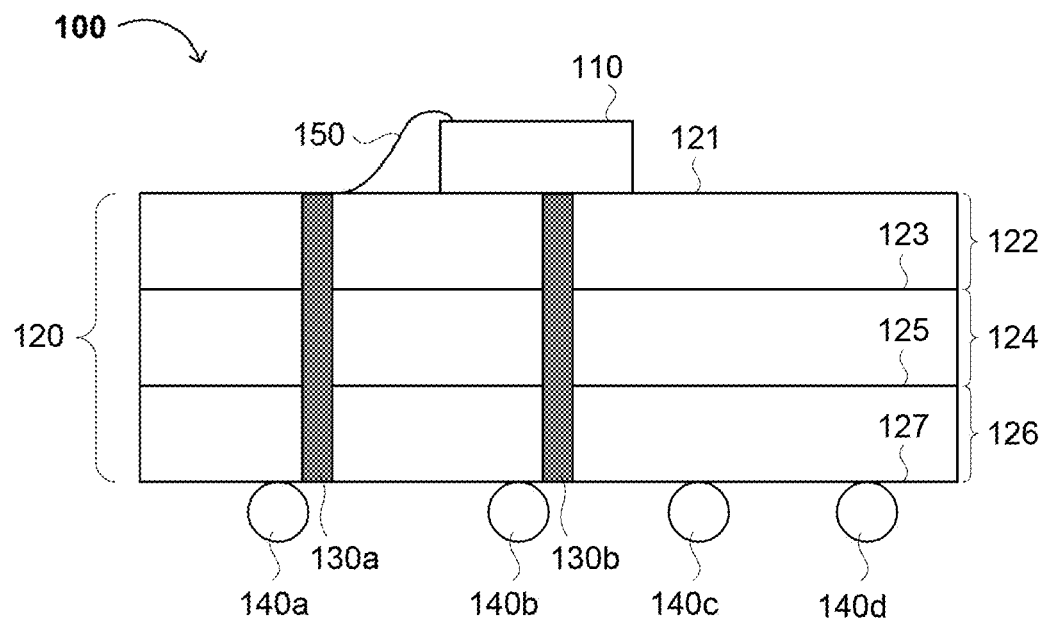
FIG. 1A is a diagram showing a cross-section of a conventional BGA package.

Reference will now be made in detail to various embodiments of the invention, examples of which are illustrated in the accompanying drawings. While the invention will be described in conjunction with the exemplary embodiments provided below, the embodiments are not intended to limit the invention. On the contrary, the invention is intended to cover alternatives, modifications and equivalents that may be included within the scope of the invention as defined by the appended claims. Furthermore, in the following detailed description, numerous specific details are set forth in order to provide a thorough understanding. However, the present invention may be practiced without these specific details. In other instances, well-known methods, procedures, components, and circuits have not been described in detail so as not to unnecessarily obscure aspects of the present disclosure.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "determining," "manipulating," "transforming," "displaying" or the like, refer to the action and processes of a computer, data processing system, logic circuit or similar processing device (e.g., an electrical, optical, or quantum computing or processing device) that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "connected to," "coupled with," "coupled to," and "in communication with" (which terms also refer to direct and/or indirect relationships between the connected, coupled and/or communicating elements unless the context of the term's use unambiguously indicates otherwise) may be used interchangeably, but these terms are also generally given their art-recognized meanings.

The invention, in its various aspects, will be explained in greater detail below with regard to exemplary embodiments.

An Exemplary Substrate

Figure 4:
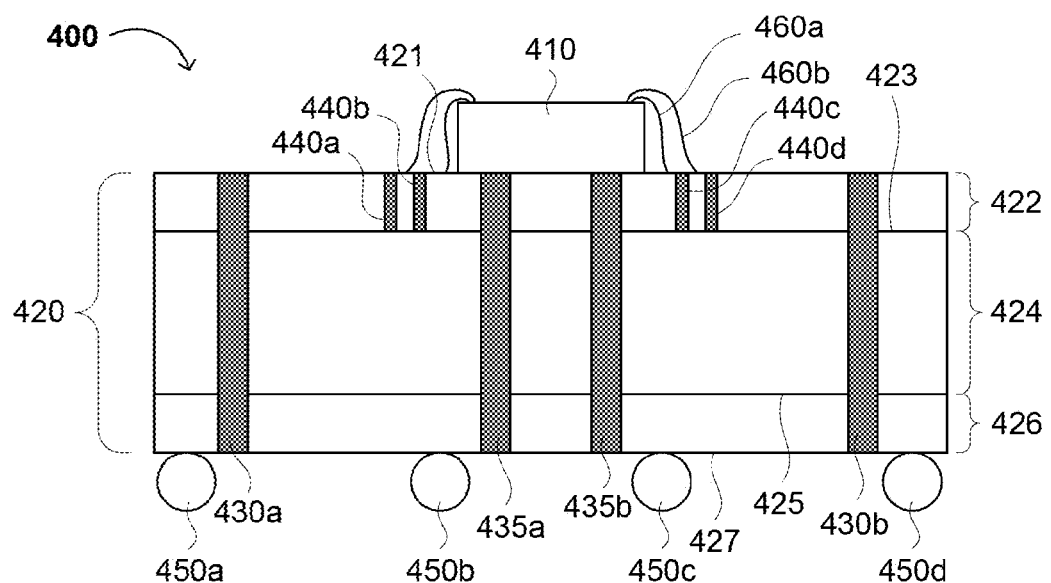
FIG. 4 is a diagram showing a cross-section of a BGA substrate according to the present disclosure, including both laser vias and mechanical vias.

In one aspect, the present disclosure relates to a BGA substrate comprising a plurality of laser vias in at least an uppermost layer of the substrate and a plurality of mechanical vias through all layers of the substrate. FIG. 4 shows an exemplary cross-section of a BGA package 400. The BGA package 400 generally comprises a die 410, a plurality of bond pads (not shown) on the die 410, a substrate 420, mechanical vias 430a-b and 435a-b, laser vias 440a-d, and a plurality of ball bonds 450a-d, and a plurality of wire bonds 460a-b.

The die 410 is located on or over the uppermost layer 422 of the substrate 420. In general, a plurality of bond pads (not shown) is on the uppermost surface of the die 410. The bond wires 460a-d are connected to the bond pads and the substrate traces 421 on the upper surface of the uppermost substrate layer 422. In general, each of a first subset of the traces 421 are electrically connected to at least one of the laser vias 440a-d in the uppermost substrate layer 422. The laser vias 440a-d are, in turn, connected to one or more traces 423 on the middle substrate layer 424, and the traces 423 are electrically connected to one or more of the mechanical vias 430a-b and 435a-b. The mechanical vias 430a-b and 435a-b electrically connect traces 423 and traces 427 on the lowermost surface of the lowermost substrate layer 426. Consequently, the traces 427 are connected to the ball bonds 440 on the underside of the lowermost substrate layer 426.

The substrate 420 comprises an uppermost layer 422, a lowermost layer 426, and a middle layer 424. Suitable substrate layer materials may include a prepreg material, such as a fiber-based mechanical support material impregnated with a polymer. Conductive traces 423 and 425 may be formed on substrate layers 424 and 426, respectively, or below substrate layers 422 and 424, respectively. Alternatively, conductive traces 423 and 425 are formed on opposite sides of the middle substrate layer 424. The layers 422, 424, and 426 of the substrate 420 are configured to support electrical connections between the wire bonds 460, the traces 421, 423, 425, and 427, the laser vias 440a-d, the mechanical vias 430a-b and 435a-b, and the external package connections (e.g., ball bonds) 450a-d.

Figure 1B:
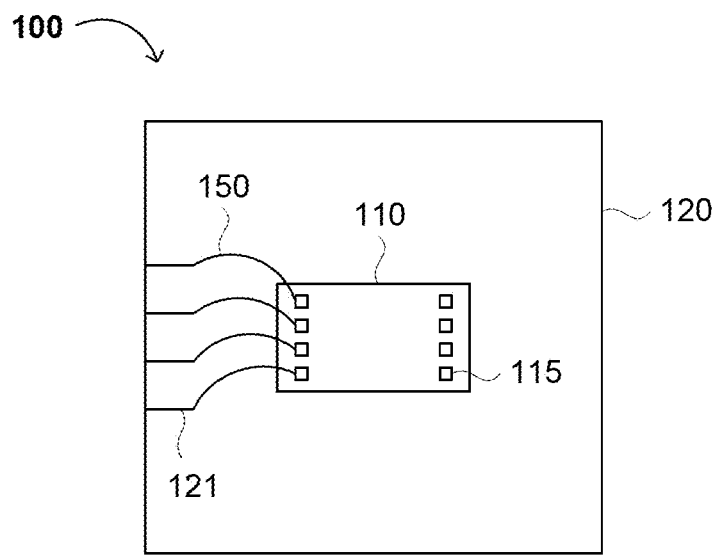
FIG. 1B is a diagram showing a top-down view of the conventional BGA package of FIG. 1A.
Figure 1C:
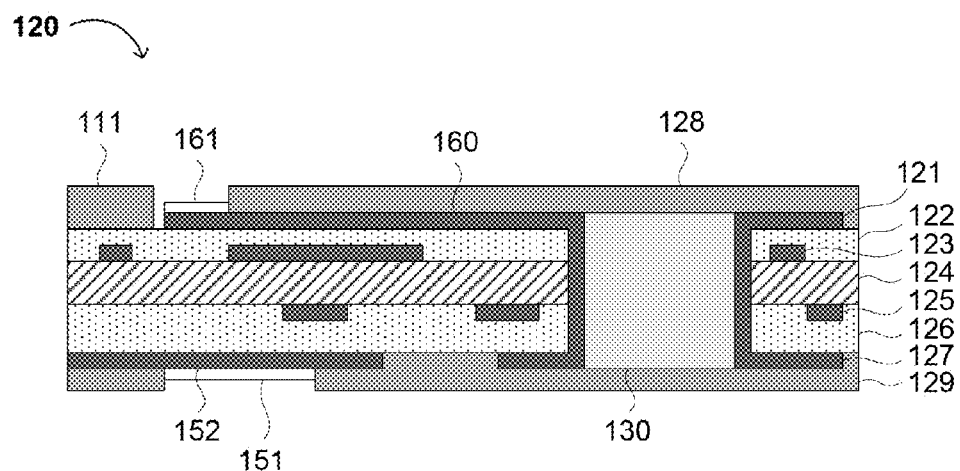
FIG. 1C is a diagram showing a more detailed cross-section of a conventional BGA substrate.
Figure 2:
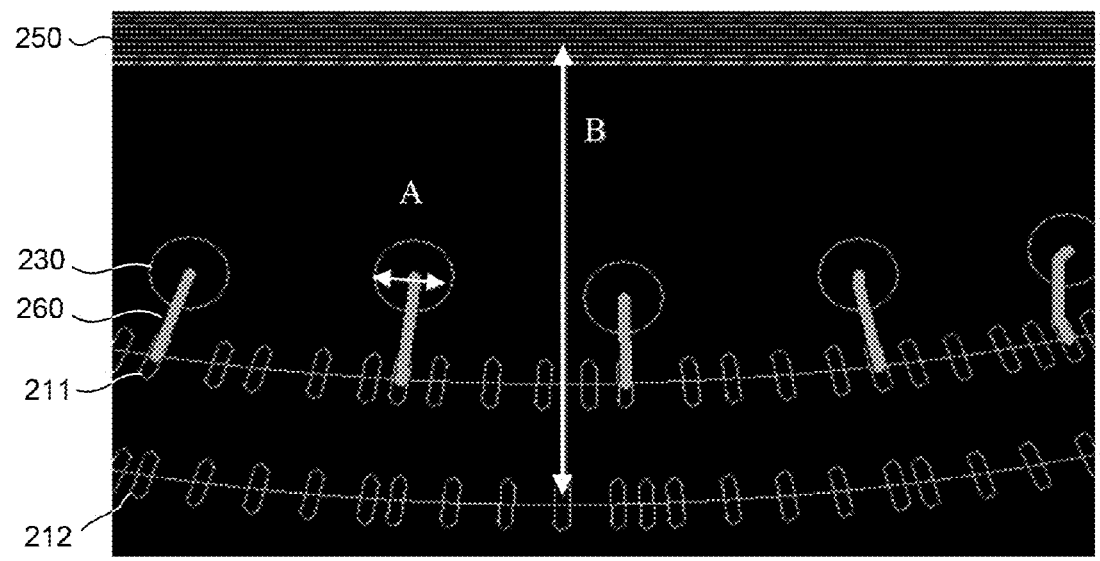
FIG. 2 is a diagram showing a top-down view of a conventional BGA substrate having only mechanical vias.
Figure 3:
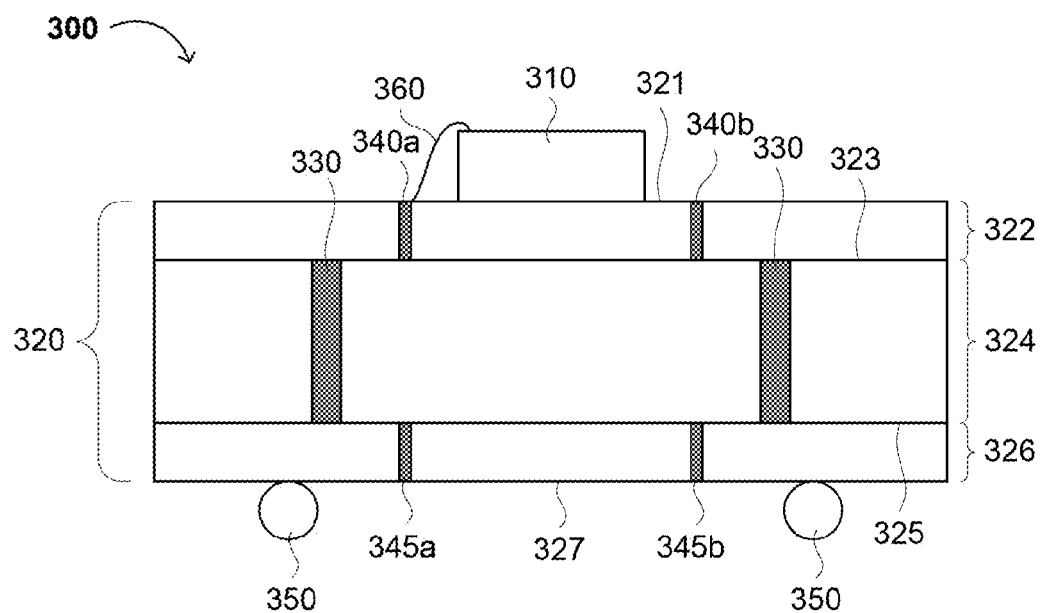
FIG. 3 is a diagram showing a cross-section of an alternative conventional BGA substrate.

In various embodiments, subsets of one or more wire bonds 460 are attached or bonded to a bond pad on die 410 in accordance with techniques known in the art. The wire bonds 460 may comprise gold wires. Each wire bond 460 is also connected (e.g., attached or bonded) to a corresponding first trace 421 on the uppermost substrate layer 422. Each trace 421 is connected to either a laser via (e.g. one of laser vias 440a-d) or a mechanical via (e.g., one of mechanical vias 430a-b). Generally, a trace 421 is not connected or routed to a mechanical via 435a-b under the die 410. Traces 421 and laser vias 440a-d are generally closer to the die 410 than (i) the mechanical vias 430a-b and (ii) conventional mechanical vias (e.g., as shown in FIGS. 1A and 2). Thus, at least one subset of wire bonds 460 is relatively shorter and/or thinner than conventional wire bonds (e.g., wire bonds 150 in FIGS. 1A-1B).

The laser vias 440a-d enable electrical connectors between the wire bonds 460a-b and the mechanical vias 430a-b and 435a-b (and thus, to the ball bonds 450a-d). Each of the laser vias 440b-c are formed at a first predetermined distance from the die 410, and each of the laser vias 440a and 440d are formed at a second predetermined distance from the die 410.

In various embodiments, the laser vias 440a-d have a substantially smaller diameter than that of the mechanical vias 430a-b and 435a-b. In various embodiments, the diameter of laser vias 440a-b can be at least about 10%, 20%, 30%, or any other value or range of values of at least 10% less than the diameter of the mechanical vias 430a-b and 435a-b. The laser vias may primarily comprise or consist essentially of a metal (e.g., copper or aluminum), an alloy (e.g., aluminum copper, nickel copper, or titanium-tungsten alloy), a compound (e.g., titanium nitride, tantalum nitride, tungsten nitride), or a combination thereof.

Routing traces 421, 423, 425, and 427 (not shown in top-down view) are located on each layer 422, 424, and 426 of the substrate 420. The routing traces are adapted to electrically connect at least one of the wire bonds 460a-b to the external package connections (e.g., the ball bonds 450a-d) in conjunction with laser vias 440a-d and mechanical vias 430a-b and 435a-b. The traces may comprise or consist essentially of a metal (e.g., copper or aluminum), an alloy (e.g., aluminum-copper, nickel-copper, or titanium-tungsten alloy), a conductive compound (e.g., titanium nitride, tantalum nitride, tungsten nitride), or a combination thereof.

A first set of traces 421 on the uppermost substrate layer 422 is configured to independently electrically connect one or more wire bonds 460a-d to one or more of the mechanical vias 430a-b or one of the plurality of the laser vias 440a-d. Traces 421 comprise a bonding finger (not shown) adapted for wire bonding to a wire bond 460a-b, and a conductive line from the bonding finger to (i) one or more of the laser vias 440a-d or (ii) one or more of the mechanical vias 430a-b. A second set of traces 423 (not shown in top-down view) on the middle substrate layer 424 is configured to electrically connect one or more laser vias 440a-d to one or more of the mechanical vias 430a-b and 435a-b. Also, part of the surface area of the middle substrate layer 424 can provide a ground plane, power plane, or electromagnetic shield function, using the same conductive material layer as for the traces 423. The traces (or other conductive pattern) 425 on the lowermost substrate layer 426 generally provide(s) a ground plane, power plane, and/or electromagnetic shield function. However, traces or conductive pattern 425 can also provide electrical connections between two or more mechanical vias 430a-b and 435a-b. A lowermost set of traces 427 is located on the underside of the lowermost substrate layer 426. Traces 427 connect the mechanical vias 430a-b and 435a-b to the ball bonds 450a-d. Suitable ball bonds 450a-d may include a solder material, and in some embodiments, a lead-free solder material as described herein.

The mechanical vias 430a-b and 435a-b also enable electrical connection between the wire bonds 460 and the ball bonds 450. The mechanical vias 430a-b and 435a-b are mechanically drilled through all of the layers 422, 424, and 426 of the substrate 420. In other words, the mechanical vias 430, 435 extend from the uppermost surface of the uppermost layer 422 through the lowermost substrate layer 426. Mechanically drilling the vias 430a-b and 435a-b results in diameters substantially greater than the diameter of the vias formed by laser drilling (e.g., laser vias 440a-d). In various embodiments, the diameter of the mechanical vias 430a-b and 435a-b is at least 10%, 20%, 30% or any other value of at least 10% greater than the diameter of the laser vias 440a-d. The mechanical vias 430a-b and 435a-b comprise at least one inner mechanical via 435a-b and at least one outer mechanical via 430a-b. In one embodiment, the outer mechanical vias 430a-b are formed at a location further from the die 410 than the laser vias 440a-b. In other embodiments, the inner mechanical vias 435a-b are located directly under the die 410.

The mechanical vias 430a-b and 435a-b may comprise a liner layer (not shown in FIG. 4) along the sidewalls of the mechanical vias 430a-b and 435a-b. The liner layer may comprise an adhesive layer and/or a barrier layer. In addition, mechanical vias 430a-b and 435a-b may further comprise a bulk conductor, such as a metal (e.g., copper) and/or other electroplatable or depositable metal, such as aluminum, tungsten, titanium, or a combination or alloy thereof.

In various embodiments, external connectors 450a-d may comprise a standard ball grid array (BGA), a fine pitch ball grid array (FPBGA), an ultrafine ball grid array (UFBGA), a super ball grid array (SBGA), a tape array BGA, etc. External connectors may be arranged in a pattern of concentric rings or other geometric shapes (e.g., a square, a rectangle, etc.), typically in an X-by-Y array of balls (which may have an N-by-M opening therein), where X and Y are each independently an integer of at least 2, 4, 8, 10 or more, and N and M are each independently an integer less than X and Y, respectively (e.g., N<X, X−1, X−2, etc, and M<Y, Y−1, Y−2, etc.) on the surface of the lowermost substrate layer 426. Each of the external connectors comprises a ball bond 450a, 450b, 450c, or 450d that may be electrically connected to a bump pad (not shown), which in turn is in electrical connection with one of a plurality of conductive traces 427 electrically connected to a corresponding mechanical via 430a-b or 435a-b. Ball bonds 450a-d may comprise a solder bump or a solder ball. One suitable composition for the ball bonds 450a-d includes a lead-free solder material, such as a tin alloy, silver alloy, and/or a copper alloy containing from 90 to 98% tin, 1.8 to 8% silver, and from 0.2-2% copper (percentages being by weight, volume or moles/atoms).

Figure 5A:
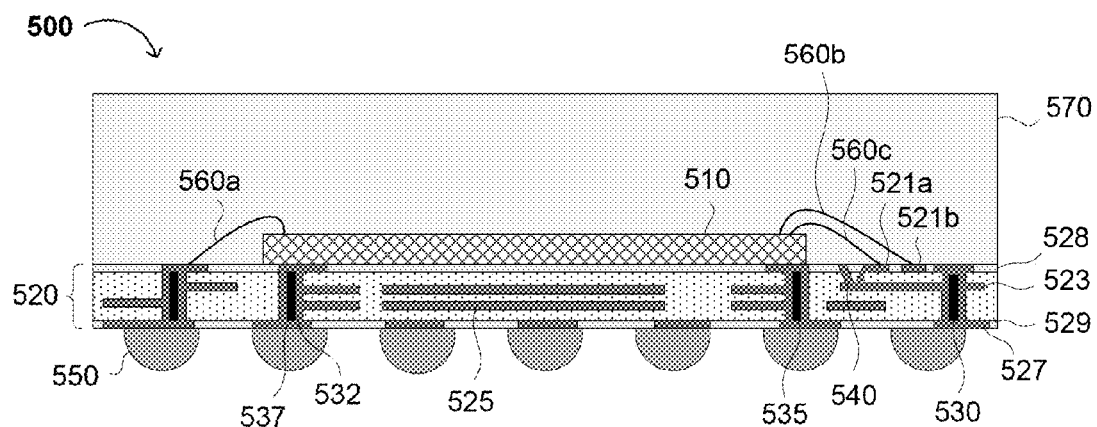
FIG. 5A is a diagram showing a cross-section of a BGA package according to the present disclosure.

FIG. 5A illustrates an exemplary hybrid via BGA package 500, consistent with the embodiment 400 in FIG. 4. BGA package 500 comprises external package connections 550, substrate 520, die 510, wire bonds 560a-c, and insulating layer 570. The insulating layer 570 is formed over the substrate 520 and die 510. In various embodiments, the insulation layer 570 comprises a plastic encapsulant, as is known in the art.

The die 510 is located on or over the uppermost layer (not shown in FIG. 5A) of the substrate 520. In general, a plurality of bond pads (not shown) is on the uppermost surface of the die 510. The bond wires 560a-c are connected to the bond pads and to a subset of the traces 521 on the upper surface of the substrate 520. In general, each of the subset of traces 521 is electrically connected to a laser via 540 or to a mechanical via 530. The laser via 540 is, in turn, connected to one or more traces 523 on the middle substrate layer (not shown in FIG. 5A), and the traces 523 are electrically connected to one or more of the mechanical vias 530 and 535. The mechanical vias 530 and 535 electrically connect the traces 521 or 523 (or, optionally, traces 525) to one or more traces 527 on the lowermost surface of the substrate 520. In turn, the traces 527 are connected to the ball bonds 550 on the underside of the substrate 520.

As described elsewhere herein, the substrate 520 can comprise an uppermost layer, a lowermost layer, and a middle layer. Suitable substrate layer materials may include a prepreg material, as previously discussed. Conductive traces 523 and 525 are generally formed on the middle and lowermost substrate layers, respectively. An insulation layer 528 can be formed on or over the uppermost substrate layer, and an insulation layer 529 can be formed on or under the lowermost substrate layer. A passivation layer 570 is formed over the die 510, the conductive traces 521a-b, and the insulation layer 528.

In various embodiments, subsets of one or more wire bonds 560a-c are attached or bonded to a bond pad on die 510, as discussed herein. Each wire bond 560 is connected (e.g., attached or bonded) to a corresponding first trace 521 on the substrate 520. Each trace 521 is connected to either a laser via 540 or a mechanical via 530.

The laser via 540 enables electrical connections between the wire bonds 560a-c and the mechanical vias 530 and 535 (and thus, to the ball bonds 550). The laser via 540 is formed at a predetermined distance from the die 510, and has a substantially smaller diameter than that of the mechanical vias 530 and 535, as discussed herein. In various embodiments, the laser via 540 has sidewalls on which portions of the conductive trace 521a is formed. Additionally, a bottom portion of the laser via 540 is in contact with an upper surface of the trace 523 on the middle substrate layer that is, in turn, electrically connected to the mechanical via 530. The laser via 540 may have sloped sidewalls, such that the upper portion of the laser via 540 has a greater width than the lower portion of the laser via 540.

Routing traces 521, 523, and 527 are adapted to electrically connect at least one of the wire bonds 560a-c to the external package connectors (e.g., the ball bonds 550) in conjunction with laser via 540 and mechanical vias 530 and 535. The traces may have a composition as discussed above with regard to FIG. 4. The first set of traces 521, second set of traces 523, traces or conductive pattern 525, and lowermost set of traces 527 generally have the same structure and function as traces 421, 423, 425 and 427 in FIG. 4. Suitable ball bonds 550 are structurally and/or functionally at least similar to ball bonds 450a-d in FIG. 4. However, in one embodiment, one or more ball bonds 550 may be located under a mechanical via 530 or 535.

The mechanical vias 530 and 535 also enable electrical connection between the wire bonds 560 and the ball bonds 550, as discussed herein. The mechanical vias can comprise at least one inner mechanical via 535 and at least one outer mechanical via 530. In general, the outer mechanical vias 530 are formed at a location further from the die 510 than the laser via 540, and the inner mechanical vias 535 are located under the die 510. The mechanical vias 530 and 535 may comprise a liner layer 532 along the sidewalls of the mechanical vias 530 and 535, such as an adhesive layer and/or a barrier layer. In addition, mechanical vias 530 and 535 may further comprise a bulk layer 537, as discussed herein.

Figure 5B:
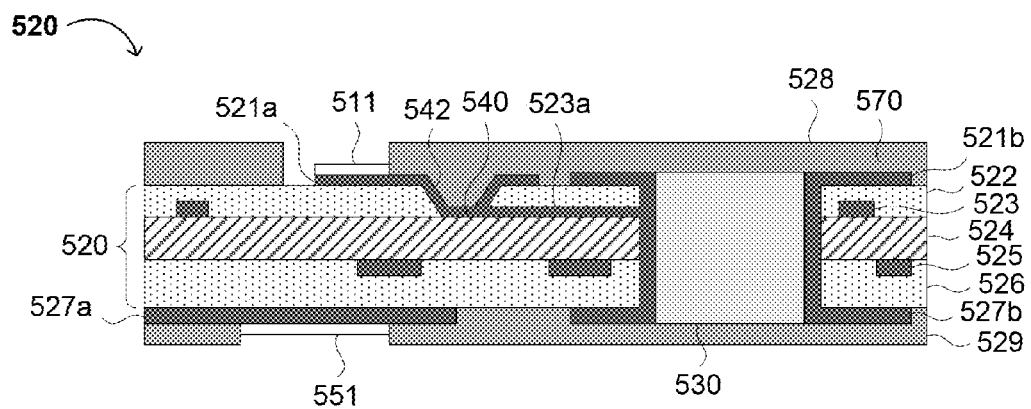
FIG. 5B is a diagram showing a cross-section of the BGA substrate consistent with the embodiment of FIG. 5A.

FIG. 5B shows a cross-section of an exemplary BGA substrate 520 consistent with the embodiment shown in FIG. 5A. Each wire bond (not shown in FIG. 5B) is configured to be attached or bonded to a bonding finger 511 on a trace 521a. The bonding finger 511 is formed (and/or exposed) in an opening in passivation layer 528 on the uppermost substrate layer 522. The passivation layer 528 may be formed over the uppermost substrate layer 522, the traces 521a-b, the laser via portions 540 and 542, and the mechanical via 530. Each trace 521a may comprise the bonding finger 511 exposed by the opening in a predetermined location on the substrate 520, a sidewall portion 542 of the laser via, and a bottom portion 540 of the laser via. The bottom portion of the laser via 540 may have a width of from about 50 µm to about 1000 µm (and in one embodiment, from about 150 µm to about 230 µm).

In various embodiments, an exposed bump pad 551 is formed in an opening in passivation layer 529 on or under the lowermost substrate layer 526, to enable attachment of the ball bonds (not shown) or other external packaging connectors. The exposed bump pad 551 contacts a trace 527a on the lowermost substrate layer 526. Trace 527a is electrically connected to another mechanical via similar or identical to mechanical via 530. Substrate layers 522, 524 and 526 are generally as described elsewhere herein, and traces 523 and 525 are generally as described elsewhere herein for traces between the uppermost and lowermost layers of traces (e.g., traces 521a-b and 527a-b).

Figure 6:
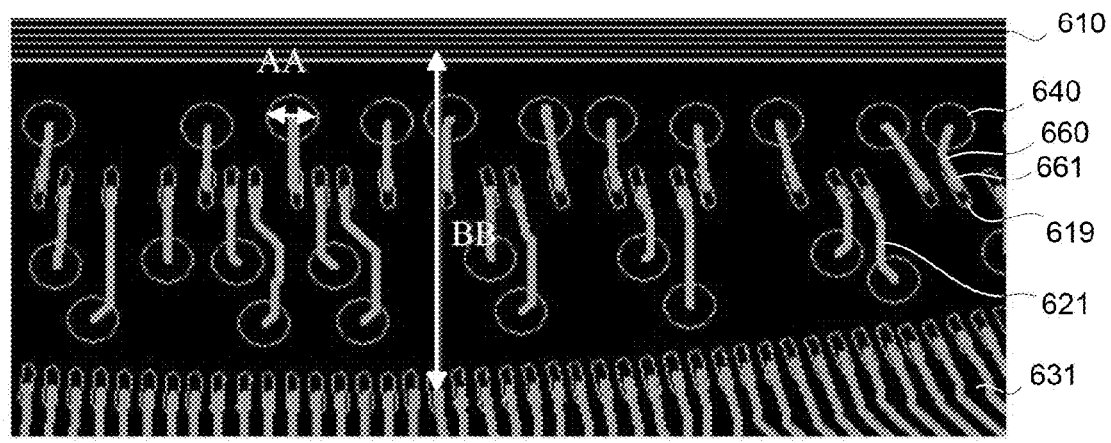
FIG. 6 is a top-down view of an exemplary embodiment of a BGA substrate having laser vias at predetermined distances from the die according to the present disclosure.

FIG. 6 illustrates an exemplary top-down view of an exemplary BGA substrate in accordance with the present disclosure. The relatively narrower diameter of the laser vias (designated by the double-headed arrow labeled "AA") enables multiple placement capabilities. As shown in FIG. 6, each of the laser vias 640 are formed at a first predetermined distance from the die 610, a second predetermined distance from the die 610, or a third predetermined distance from the die 610. Each wire bond (not shown) is configured to be attached or bonded to a bonding finger 611 of trace 621. The bonding finger 611 is located in an opening 619 in the passivation layer on the substrate (not shown). The traces 631 are generally connected to mechanical vias (not shown).

Exemplary Method(s) for Manufacturing a Hybrid Via Ball Grid Array

Figure 7:
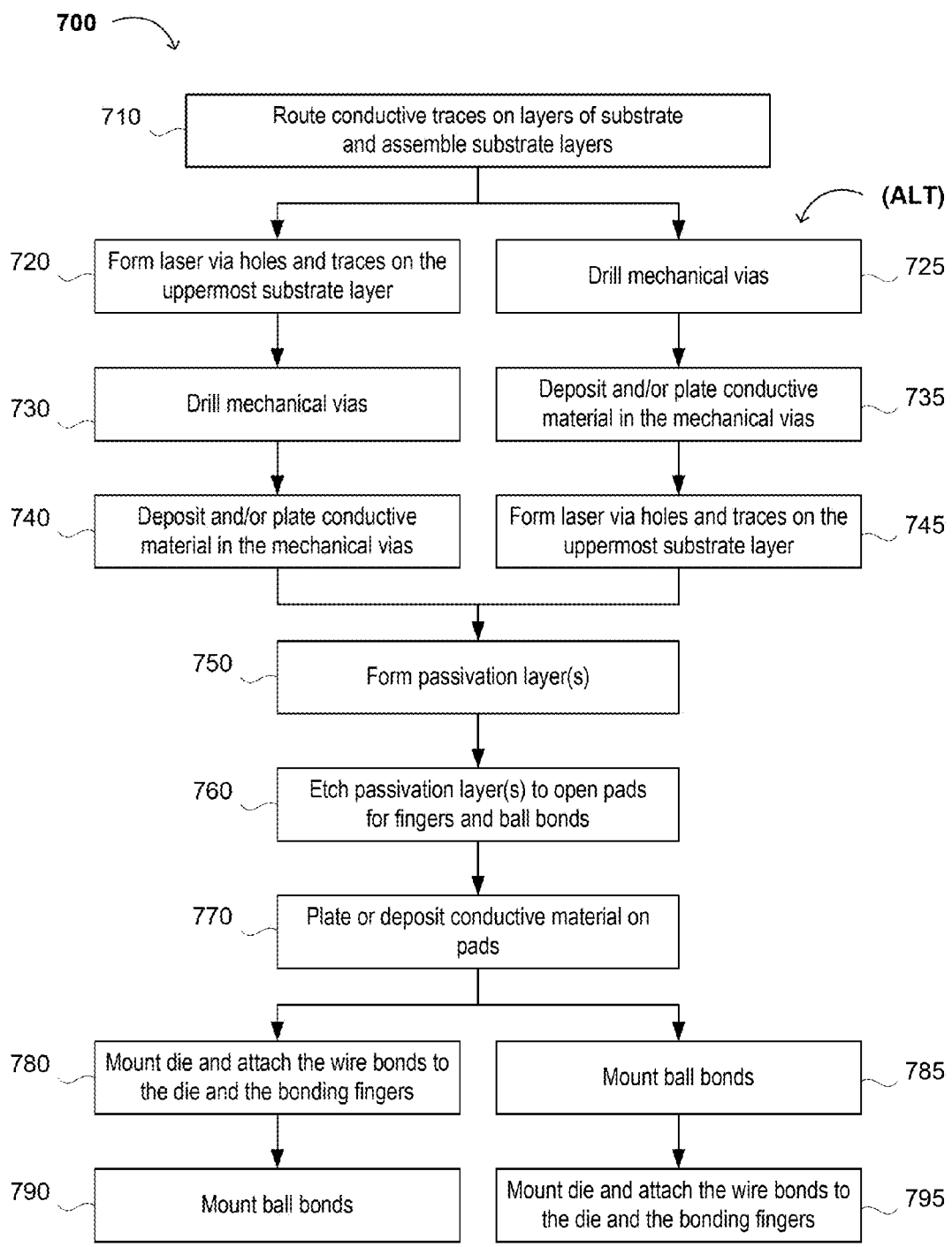
FIG. 7 is a flow chart of an exemplary process for manufacturing a BGA substrate according to the present disclosure.

A further aspect of the invention relates to a method of manufacturing a ball grid array package comprising a plurality of laser vias in at least an uppermost layer of the substrate. FIG. 7 shows an exemplary method 700 of manufacturing a packaged integrated circuit (IC) in a ball grid array package.

At 710, conductive traces are routed on layers of the BGA substrate, and the layers of the substrate are assembled. For example, as described herein, a set of traces on a middle substrate layer is routed to electrically connect laser vias in an uppermost substrate layer to a subset of mechanical vias through the entire BGA substrate. Another set of traces on the lowermost substrate layer is routed to electrically connect the mechanical vias to the external package connectors (e.g., ball bonds 550 in FIG. 5A). These traces may be formed conventionally, by blanket deposition of one or more conductive materials (as described herein) and patterning by photolithography and development, or by printing a conductive paste in the desired pattern. Thereafter, the various layers of the substrate are assembled by one or more techniques known in the art (e.g., by gluing, crimping, applying suitable amounts of heat and/or pressure, combinations thereof, etc.)

At 720, laser via holes are formed in at least the uppermost substrate layer, and traces are formed thereon. In various embodiments, forming the laser vias comprises laser drilling one or more via holes in the uppermost layer of the substrate. Each of the laser vias are formed at least at a first predetermined distance from the die. In one embodiment, the laser vias may also be formed at a second predetermined distance (and optionally at a third predetermined distance) from the die. Each trace on the uppermost substrate layer is routed to electrically connect at least one wire bond from the die to a location of either a laser via or a mechanical via. The traces on the uppermost substrate layer are formed in substantially the same manner as the other traces in the substrate.

At 730, mechanical vias are drilled through all of the layers of the BGA substrate. In various embodiments, drilling the mechanical vias comprises mechanically drilling a plurality of holes in the substrate at locations farther away from the die location than the locations of the laser vias. However, in some embodiments, inner mechanical via holes may be drilled in the die location. After mechanically drilling the holes for the mechanical vias, at 740, one or more conductive materials (such as a metal and/or a conductive compound) is/are deposited on sidewalls of the mechanical via holes to form a liner layer. Depositing the material on the sidewalls of the holes may comprise sputtering, evaporation, or chemical vapor deposition of the conductive material(s). A bulk metal is subsequently deposited on the liner layer. The bulk metal may be electroplated and/or electrolessly plated on the liner layer on the sidewalls of the mechanical vias by techniques known in the art.

In an alternative embodiment, the processing sequence may be rearranged. For example, at 725, mechanical vias can be drilled through all of the layers of the BGA substrate. Thereafter, at 735, one or more conductive materials can be deposited in the mechanical via holes to form the mechanical vias, and at 745, laser via holes can be formed in the uppermost substrate layer and traces formed on the uppermost substrate layer and in the laser via holes. In a further alternative, the laser via holes can be formed and the traces formed on the uppermost substrate layer and in the laser via holes prior to depositing conductive material(s) in the mechanical via holes. For example, after depositing the liner layer material(s) on the mechanical via sidewalls and on the uppermost substrate layer, the liner layer material(s) can be patterned to form a seed layer for electrodeposition or electroless deposition of the bulk conductor.

At 750, one or more passivation layers are formed on the uppermost and/or lowermost surfaces of the substrate. The passivation layer may comprise a conventional insulator (e.g., silicon dioxide and/or silicon nitride), deposited by techniques known in the art (e.g., chemical vapor deposition, which may be plasma-enhanced or plasma-assisted). Depending on whether a passivation layer is formed on the uppermost and/or lowermost substrate surface, at 760, the uppermost passivation layer is etched to open areas for bonding fingers, and the lowermost passivation layer is etched to open pad areas for ball bonds.

At 770, a conductive material is plated or otherwise deposited on the bonding fingers and/or pad areas. The conductive material may be a material conventionally used for wire bonding and/or forming or adhering ball bonds in a BGA package. At 780, the die is mounted on the substrate, and the wire bonds are attached to the die and the bonding fingers. At 790, the ball bonds are mounted on the substrate (e.g., on the conductive material on the pad areas 551 in FIG. 5B). Alternatively, at 785, the ball bonds can be mounted on the substrate before the die is mounted on the substrate and the wire bonds attached to the die and the bonding fingers at 795.

CONCLUSION/SUMMARY

Thus, embodiments of the present disclosure provide a circuit, architecture, system and method for a ball grid array package comprising a plurality of laser vias in at least an uppermost layer of the substrate. The present ball grid array package enables increased wire bonding and other assembly yields, and decreases substrate cost due to the length and/or diameter of the wires used in wire bonding. The present arrangement of laser vias and mechanical vias in a packaging substrate may also be applied to other types of packages, bonding wires, etc.

The foregoing descriptions of embodiments of the present disclosure have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A packaged integrated circuit, comprising:
    a die, the die including a plurality of bond pads;
    a plurality of wire bonds electrically contacting the plurality of bond pads; and
    a substrate comprising a plurality of layers, wherein the plurality of layers include at least (i) an uppermost layer, (ii) a lowermost layer, and (iii) a middle layer disposed between the uppermost layer and the lowermost layer, wherein the substrate is configured to electrically connect the plurality of wire bonds and a plurality of external package connectors, wherein the substrate includes (i) a plurality of mechanical vias, each mechanical via being through all of the plurality of layers of the substrate, and (ii) a plurality of laser vias in the uppermost layer of the substrate but not in the lowermost layer of the substrate, wherein the lowermost layer of the substrate does not include any laser via, wherein each of the plurality of laser vias is closer to the die than each of the plurality of mechanical vias (a) that do not overlap with the die or (b) that are not covered by the die, and wherein each of the plurality of mechanical vias is connected to at least one of the plurality of external package connectors via a corresponding trace on a lowermost surface of the lowermost layer of the substrate.

2. The packaged integrated circuit of claim 1, wherein:
    each of the plurality of wire bonds is connected to a corresponding trace on the uppermost layer of the substrate; and
    each trace on the uppermost layer of the substrate is configured for independent electrical connection to either (i) one or more of the plurality of mechanical vias or (ii) one or more of the plurality of laser vias.

3. The packaged integrated circuit of claim 1, further comprising an insulation layer over the uppermost layer of the substrate.

4. The packaged integrated circuit of claim 1, wherein each of the plurality of laser vias have a first diameter, and each of the plurality of mechanical vias have a second diameter, and wherein the first diameter is smaller than the second diameter.

5. The packaged integrated circuit of claim 1, wherein the plurality of mechanical vias comprise (i) a plating layer along sidewalls of each mechanical via, and (ii) a bulk conductor substantially filling a remainder of each mechanical via.

6. The packaged integrated circuit of claim 1, wherein each of the plurality of laser vias are at a fixed distance from the die.

7. The packaged integrated circuit of claim 6, wherein:
    a first subset of the plurality of laser vias are at a first fixed distance from the die; and
    a second subset of the plurality of laser vias are at a second fixed distance from the die.

8. The packaged integrated circuit of claim 1, wherein each laser via comprises (i) a sidewall portion and (ii) a bottom portion in an opening in the uppermost layer of the substrate, the bottom portion being in contact with a corresponding trace on the middle layer of the substrate, the trace on the middle layer of the substrate being in electrical connection with a particular mechanical via of the plurality of mechanical vias to electrically connect the laser via to the at least one external package connector via the corresponding trace on the lowermost surface of the lowermost layer of the substrate that is associated with the particular mechanical via.

9. The packaged integrated circuit of claim 1, wherein the plurality of external package connectors comprise a ball grid array.

10. The packaged integrated circuit of claim 2, wherein each of the traces on the uppermost layer of the substrate comprises a bonding finger, and each of the plurality of wire bonds is configured to be attached or bonded to a corresponding one of the bonding fingers.

* * * * *